United States Patent
Bichrt

[11] Patent Number: 6,162,300
[45] Date of Patent: Dec. 19, 2000

[54] EFFUSION CELL

[76] Inventor: Craig E. Bichrt, 935 Chippewa Path, Hudson, Wis. 54016

[21] Appl. No.: 09/400,043

[22] Filed: Sep. 21, 1999

Related U.S. Application Data

[60] Provisional application No. 60/101,782, Sep. 25, 1998.

[51] Int. Cl.[7] .................................................. C23C 14/00

[52] U.S. Cl. ........................................... 118/726; 392/389

[58] Field of Search .............................. 118/726; 392/389

[56] References Cited

U.S. PATENT DOCUMENTS

| | | | |
|---|---|---|---|
| 4,181,544 | 1/1980 | Cho | 148/175 |
| 4,239,955 | 12/1980 | Cho | 219/271 |
| 4,426,569 | 1/1984 | Miller et al. | 219/272 |
| 4,543,467 | 9/1985 | Eisele et al. | 219/271 |
| 4,813,373 | 3/1989 | Demay et al. | 118/726 |
| 5,034,604 | 7/1991 | Streetman et al. | 250/251 |
| 5,041,719 | 8/1991 | Harris et al. | 219/390 |
| 5,080,870 | 1/1992 | Streetman et al. | 422/129 |

*Primary Examiner*—Richard Bueker
*Attorney, Agent, or Firm*—Richard C. Emery

[57] ABSTRACT

An effusion cell having a ceramic valve mechanism.

7 Claims, 6 Drawing Sheets

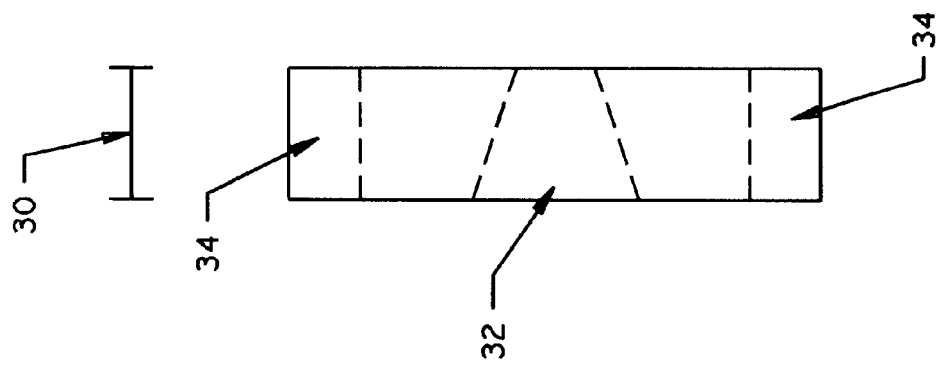
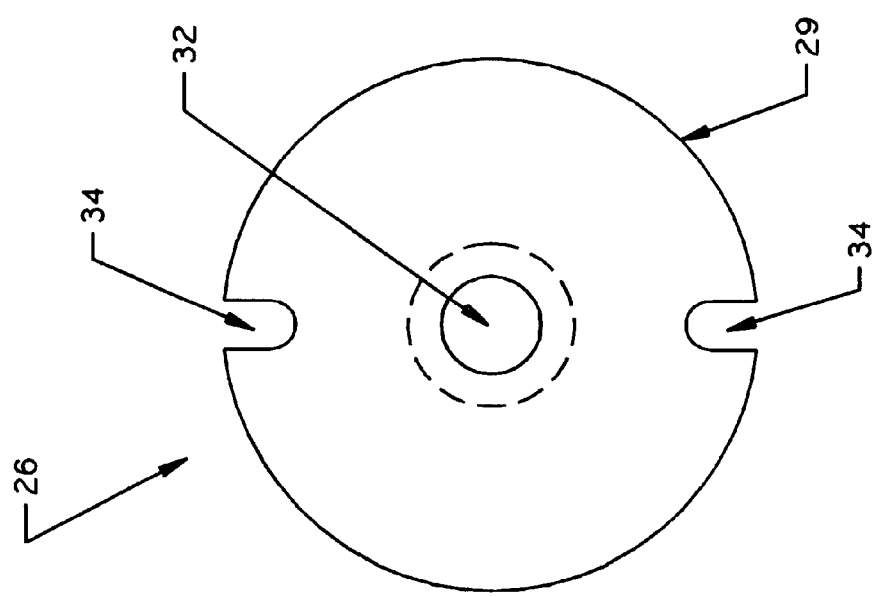
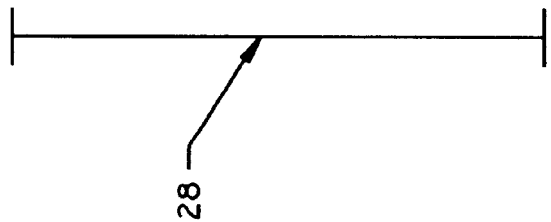

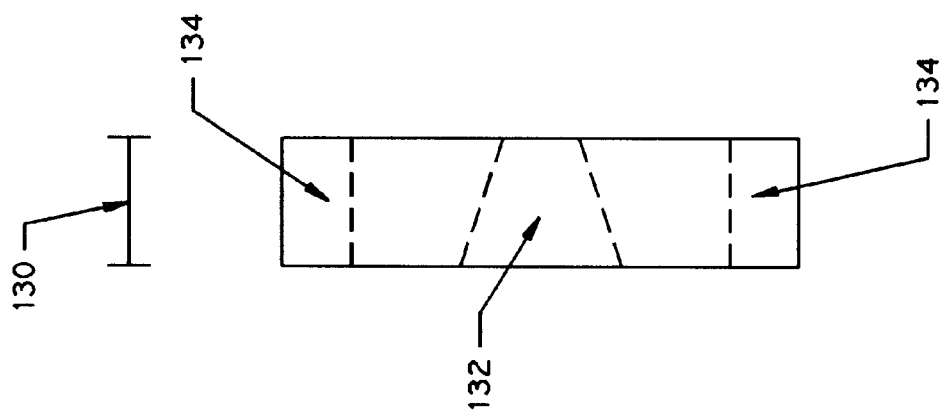
FIGURE 8
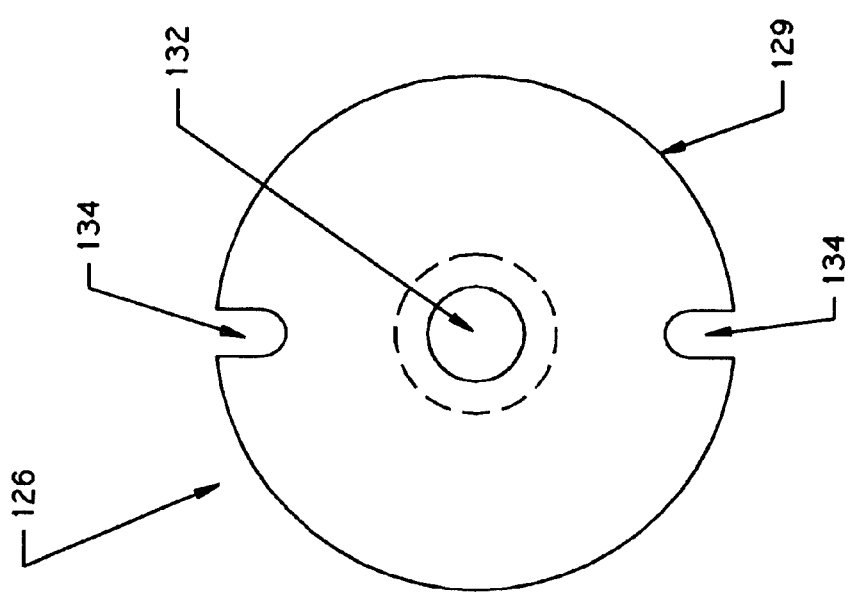
FIGURE 7
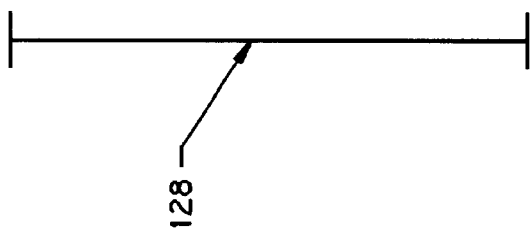

EFFUSION CELL

This application claims the benefit of provisional patent application Ser. No. 60/101,782 filed Sep. 25, 1998.

FIELD OF THE INVENTION

The invention relates to vacuum evaporation and in particular to a new type of effusion-type evaporative cell.

BACKGROUND OF THE INVENTION

Many applications exist requiring the precision deposition of various elements or compounds in extremely thin layers onto substrates. The best known of these applications is used in creating microchips and other components for the semiconductor industry. Molecular Beam Epitaxy (MBE) is capable of precision deposition and is generally accomplished by separately heating a substrate and one or more source materials in separate cells. Upon heating the source material in an effusion cell the vapor pressure is raised, forcing the vaporized source material out of the effusion cell and into a vacuum growth chamber where a beam of the vaporized source material or effluent flowing from the effusion cell condenses onto the substrate. Deposition of the source material onto the substrate results in crystals of the source material growing onto the substrate. By varying the temperature of the effusion cell, the flux rate of the molecular beam, and hence the rate of deposition, can be controlled to a limited extent. Using this heat variable MBE technique requires manually adjusting the temperature rate of the effusion cell, which process is somewhat by trial and error. This results in slowed production times, and often an inability to accomplish a graded deposition. Graded deposition is required in certain situations where the underlying substrate is not compatible with the desired outermost source material. An intermediate layer, which is compatible with both substrate and outer source material must be used. However, deposition of an intermediate layer often requires a gradual and continuous change in materials. Thus, many situations exist where the heat variable MBE technique is unworkable.

A solution to the problem of controllably varying beam fluxes involves using a valve system interposed between the exit of the effusion cell and the growth chamber. By opening the valve following raising the vapor pressure in the cell, it is possible to achieve a uniform and precision molecular beam flux into the evacuated growth chamber.

Several valve mechanisms have been proposed to controllably vary beam fluxes. Vapor sources such as effusion cells that modulate the flux with an integral metal needle valve or a movable metal shutter or screen are known in the art of Molecular Beam Epitaxy, as shown in U.S. Pat. No. 5,080,870, which is incorporated herein by reference. The majority of molten metals and resulting metal vapors are particularly reactive with other metallic species at elevated temperatures. Thus, the current sources with metal valves or metal shutters may only be used with a few relatively nonreactive metallic species. If the metallic elemental source material reacts with the valve mechanism or movable shutter, the vapor source fails and the vapors used for the vacuum deposition of thin films become contaminated. Thus, what is needed is an effusion cell capable of modulating the flux containing a corrosion resistant mechanism.

SUMMARY OF THE INVENTION

The invention finds specific application in the vacuum deposition technique referred to as Molecular Beam Epitaxy (MBE) and where a plurality of highly purified metals or other source materials are co-evaporated to form thin films on crystalline substrates.

The present invention comprises an effusion cell comprising a housing defining a distal end and a proximal end, the housing being capable of maintaining a vacuum. A crucible is located within the housing. The crucible defines at least an open end and a chamber. A ceramic valve seat defining a perimeter is adapted so the perimeter mates with the open end of the crucible. The ceramic valve seat also defines a central aperture, which is adapted to sealably mate with a ceramic needle.

In another embodiment, the present invention comprises an effusion cell comprising a housing defining a distal end and a proximal end capable of maintaining a vacuum. A crucible is located within the housing. The crucible defines at least an open end and a chamber. A ceramic valve seat defining a perimeter is adapted so the perimeter mates with the open end of the crucible. The ceramic valve seat also defines a central aperture, which is adapted to sealably mate with a ceramic needle. Means are provided for securing the relative positions of the ceramic valve seat and the ceramic needle relative to each other to form a valve mechanism, which regulates the outflow from the crucible during the MBE process. Heating means are included within the housing to heat the internal environment, including the crucible and its contents. Finally, a thermocouple is included in the housing to monitor the temperature within the housing, so the proper temperature for the MBE process can be maintained.

BRIEF DESCRIPTION OF THE DRAWINGS

FIG. 2 is a front view of the ceramic valve seat of the first embodiment of the invention.

FIG. 3 is a side view of the ceramic valve seat of the first embodiment of the invention with broken lines showing the apertures therein.

FIG. 7 is a front view of the ceramic valve seat of the second embodiment of the invention.

FIG. 8 is a side view of the ceramic valve seat of the second embodiment of the invention.

Nomenclature

Figure 1:
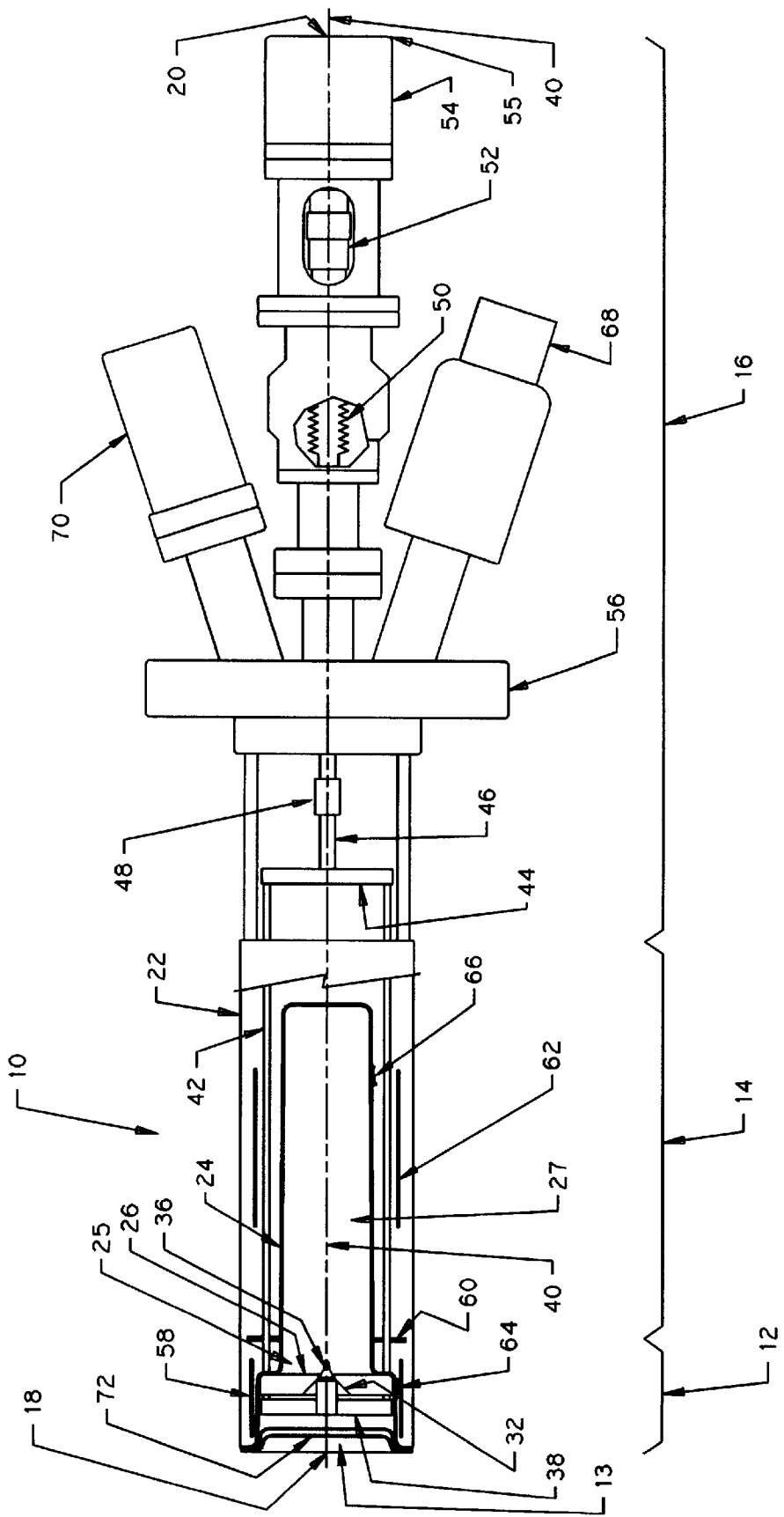
FIG. 1 is a side-view of a first embodiment of an effusion cell with portions cut away to show internal details.

10 First embodiment of effusion cell
12 Upper thermal zone
13 Open end of upper thermal zone
14 Lower thermal zone
16 Non-thermal zone
18 Distal end
20 Proximal end
22 Housing 24 Crucible
25 Open end of crucible
26 Ceramic valve seat
27 Crucible chamber
28 Diameter of ceramic valve seat
29 Perimeter of ceramic valve seat
30 Depth of ceramic valve seat
32 Central aperture
34 Tie rod slot
36 Ceramic needle
38 Upper crossbar
39 Tie rod aperture
40 Central axis
42 Tie rods
44 Lower crossbar
46 Actuation rod
48 Valve linkage disconnect
50 Bellows
52 Micrometer mechanism
54 Automated valve positioner
55 Termination point of automated valve positioner
56 Mounting flange
58 Upper heating element
60 First heat shield
62 Lower heating element
64 Upper thermocouple
66 Lower thermocouple
68 Power coupling
70 Thermocouple connector
72 Cracking baffle
110 Second embodiment of effusion cell
112 Upper thermal zone
113 Open end of upper thermal zone
114 Lower thermal zone
115 Intermediate thermal zone
116 Non-thermal zone
118 Distal end
120 Proximal end
122 Housing
124 Crucible
125 Open end of crucible
126 Ceramic valve seat
127 Crucible chamber
128 Diameter of valve seat
129 Perimeter of valve seat
130 Depth of valve seat
131 Conductance tube
132 Central aperture
133 Open end of conductance tube
134 Tie rod slot
136 Ceramic needle
138 First crossbar
139 Tie rod apertures
140 Central axis
142 First set of tie rods
144 Second set of crossbars
146 First set of actuation rods
148 Valve linkage disconnects
150 Bellows
152 Micrometer mechanism
154 Automated valve positioner
155 Termination point of automated valve positioner
156 Mounting flange
158 Upper heating element
160 Third crossbar
162 Second set of tie rods
164 Fourth crossbar
166 Second actuation rod
168 First heat shield
170 Intermediate heating element
172 Lower heating element
174 Power coupling
176 Upper thermocouple
178 Thermocouple connector
180 Intermediate thermocouple
182 Lower thermocouple
184 Cracking baffle Construction FIG. 1 shows a first embodiment of the effusion cell 10. The effusion cell 10 defines an upper thermal zone 12, a lower thermal zone 14, and a non-thermal zone 16. The open end 13 of the upper thermal zone 12 defines a distal end 18, and the termination point 55 of the automated valve positioner 54 defines a proximal end 20. A housing 22 is provided as a covering for the effusion cell 10, which extends along a central axis 40 from the upper thermal zone 12 to the mounting flange 56. The housing 22 can be constructed of any metallic, polymeric or composite material able to withstand the significant heat, pressure, and other stresses an effusion cell is subject to, as well as being capable of maintaining an evacuated state. During use, the effusion cell 10 is maintained in an evacuated state, to allow vapors emanating from heated source material to be deposited on a substrate via Molecular Beam Epitaxy (MBE). In a preferred embodiment, the housing 22 is constructed of tantalum. The effusion cell 10 is arranged in a linear manner, with the upper thermal zone 12 most distal, the lower thermal zone 14 immediately proximal of the upper thermal zone 12, and the non-thermal zone 16 proximal of the lower thermal zone 14, and terminating at the proximal end 20 of the effusion cell 10. Also contemplated and within the scope of the invention is a housing 22 comprising a water jacket (not shown) for cooling the effusion cell during the MBE process.

A crucible 24 is contained within the lower thermal zone 14, which is used to contain the source material or effluent (not shown), to be heated and deposited. The crucible 24 defines an open end 25 and a chamber 27. The crucible 24 can be constructed of any metallic, polymeric, or composite material able to withstand the significant heat, pressure, chemical and other stresses it will be subjected to when in use. In a preferred embodiment, the crucible 24 is made of pyrolitic boron nitride (PBN). However, many other materials may also be suitable, depending on the source material to be heated inside the crucible 24. Other suitable crucible materials include such ceramic materials as boron nitride, alumina, aluminum nitride, magnesia, pyrolitic graphite, graphite, beryllia, zirconia, and silicon carbide. Suitable metallic materials include molybdenum and its alloys, tantalum and its alloys, titanium, niobium, zirconium, platinum and stainless steel.

Figure 4:
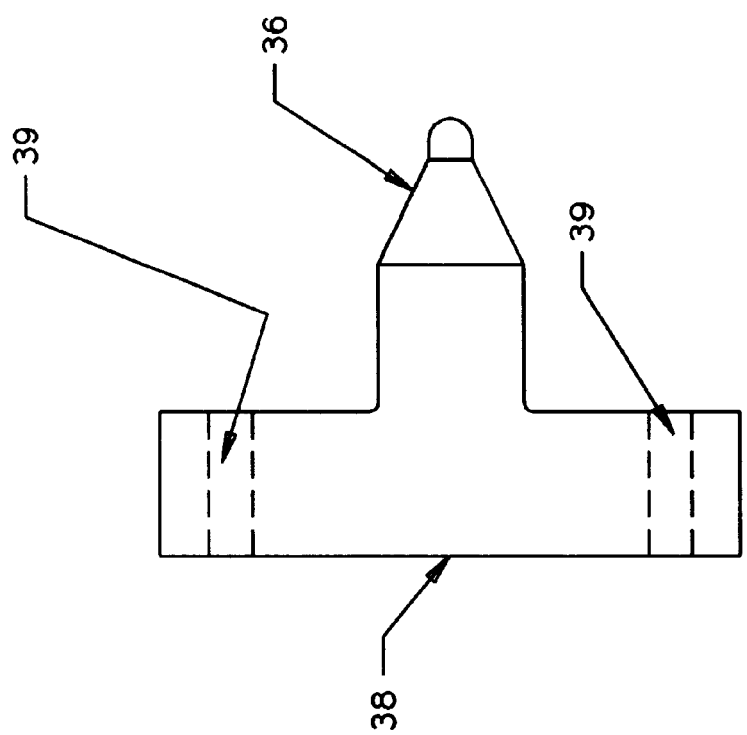
FIG. 4 is a side view of the ceramic needle and upper crossbar of the first embodiment of the invention with broken lines showing the apertures therein.

The crucible 24 is capped at its open end 25, distal of the crucible 24 with a ceramic valve seat 26 as best shown in FIGS. 3 and 4. The ceramic valve seat 26 is typically fabricated so that a gaseous tight press fit may be obtained between the open end 25 of the crucible 24 and the valve seat 26. The ceramic valve seat 26 is generally dislike and defines a diameter 28, a depth 30, and a central aperture 32. The ceramic valve seat 26 defines a central aperture 32 that is located generally equidistant from the perimeter 29 of the valve seat 26 and extends through the depth 30 of the valve seat 26. The central aperture 32 defines a tapered channel to provide improved sealing characteristics. At least one and preferably two tie rod slots 34 extend through the depth 30 of the valve seat 26.

Figure 5:
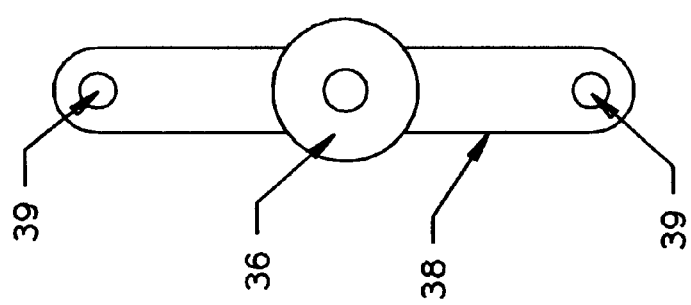
FIG. 5 is a front view of the ceramic needle and upper crossbar of the first embodiment of the invention.

As best shown in FIGS. 4 and 5, a ceramic needle 36 is provided, the outer contours of which are adapted to precisely match the central aperture 32 of the valve seat 26. In a preferred embodiment, the ceramic needle 36 has a conical shape, with the base of the cone being mounted to an upper crossbar 38, and the opposite end extending toward the central aperture 32 of the ceramic valve seat 26. The ceramic needle 36 is fixedly mounted to the upper crossbar 38. At least one and preferably two tie rod apertures 39 extend through the upper crossbar 38, in a parallel orientation with the ceramic needle 36. The taper of the cone shaped needle 36 provides mechanical flux modulation by increasing or decreasing the open area between the needle 36 and central aperture 32 of the valve seat 26. This is accomplished by moving the needle 36 in a proximal or distal direction along the axis 40 of the valve actuation assembly 38, 42, 44, 46, 48, 50, 52, and 54. In a preferred embodiment, the ceramic needle 36 and upper crossbar 38 are constructed as a single piece by conventional machining or molding techniques.

The ceramic valve seat 26 and ceramic needle 36 may be constructed from any suitable ceramic material able to withstand the substantial temperature, pressure, and chemical stresses placed thereon by the MBE process. In a preferred embodiment, the ceramic valve seat 26 and ceramic needle 36 are constructed of graphite coated with pyrolitic boron nitride. Other ceramic materials, however, such as PBN, boron nitride, alumina, aluminum nitride, magnesia, pyrolitic graphite, graphite, beryllia, zirconia, and silicon carbide, but not limited thereto, are also contemplated by and within the scope of the invention.

The valve actuation assembly 38, 42, 44, 46, 48, 50, 52, and 54 includes the upper crossbar 38, tie rods 42, lower crossbar 44, actuation rod 46, valve linkage disconnect 48, bellows 50, micrometer mechanism 52, and automated valve positioner 54. The valve actuation assembly allows the valve position to be precisely controlled from outside the vacuum environment provided by the housing 22. The ceramic needle 36 and upper crossbar 38, onto which it is mounted, are fixedly attached to at least one and preferably two tie rods 42. The tie rods 42 extend through the tie rod slots 34 of the ceramic valve seat 26 in a slidable manner allowing longitudinal movement of the upper crossbar 38, ceramic needle 36 and tie rods 42 along the central axis 40 of the valve actuation assembly. This allows the distance between the ceramic needle 36 and ceramic valve seat 26 to be varied in accordance with MBE techniques to provide a wide array of flux patterns to be used with different kinds of source materials. The tie rods 42 are fixedly attached to the upper crossbar 38 through the tie rod end aperture 39 and to the lower crossbar 44. The lower crossbar 44 is centrally attached to the actuation rod 46, which is attached to the valve linkage disconnect 48. The valve linkage disconnect 48 allows quick disconnect of the valve actuation assembly to load source material. The tie rods 42 can be constructed from a wide variety of materials including, but not limited to ceramic materials such as boron nitride, alumina, aluminum nitride, magnesia, pyrolitic graphite, graphite, beryllia, zirconia, and silicon carbide. In a preferred embodiment, the tie rods 42 are constructed from silicon carbide. Metallic materials such as molybdenum, tantalum, titanium, niobium, and zirconium are also suitable for the tie rods 42, and contemplated by and within the scope of the invention.

The valve linkage disconnect 48 is attached to a bellows 50 which allows axial movement of the valve actuation assembly from outside the vacuum environment provided by the housing 22 without violating the vacuum environment. A micrometer mechanism 52 is attached to the proximal end of the bellows 50 and provides precision longitudinal movement of the valve actuation assembly in either a proximal or distal direction along the central axis 40. An automated valve positioner 54 is attached to the proximal end of the micrometer mechanism 52, to provide automated control of the position of the micrometer mechanism 52 and distally attached ceramic needle 36 with regard to the ceramic valve seat 26.

The upper thermal zone 12 is provided with at least a single upper heating element 58. In a preferred embodiment, the upper heating element 58 is a serpentine electrically resistive filament. Thermal separation between the upper 12 and lower 14 thermal zones is provided by means of a first heat shield 60 between the upper thermal zone 12 and lower thermal zone 14. The first heat shield 60 can be made from any material able to shield the significant temperatures generated during the MBE process. In a preferred embodiment the first heat shield 60 is made of tantalum foil. The lower thermal zone 14 is provided with at least a single lower heating element 62. The first heat shield 60 and upper 58 and lower 62 heating elements allow for separate thermal environments within the effusion cell 10 which may be necessary for the particular MBE operations desired. Both the upper heating element 58 and lower heating element 62 are in electrical connection with a power coupling 68. The power coupling 68 provides separate electrical connections for the upper heating element 58 and lower heating element 62 to an electric power source (not shown), allowing different electrical currents to flow to each heating element, thus contributing to achieving separate thermal environments.

At least a single upper thermocouple 64 is situated between the housing 22 and the valve seat 26 and upper crossbar 38. The upper thermocouple 64 is in electrical connection with a thermocouple connector 70, which is connected to an external control means (not shown), to provide feedback for precisely controlling the internal temperature of the upper thermal zone 12 during the MBE process. Likewise, at least a single lower thermocouple 66 is situated between the housing 22 and the crucible 24. The lower thermocouple 66 is in electrical connection with a thermocouple connector 70 which is connected to an external control means (not shown), to provide feedback for precisely controlling the internal temperature of the lower thermal zone 14 during the MBE process. The thermocouple connector 70 provides separate connections for both the upper thermocouple 64 and lower thermocouple 66 to an external control means (not shown).

A cracking baffle 72 is optionally fitted to the distal end 18 of the effusion cell 10. The cracking baffle 72 ensures that the vaporized source material (not shown) exiting the effusion cell 10 experiences additional collisions prior to exiting the effusion cell 10. The additional collisions further dissociate or "crack" the evaporant into smaller species. The cracking baffle 72 may also be used to enhance the flux beam uniformity.

Figure 6:
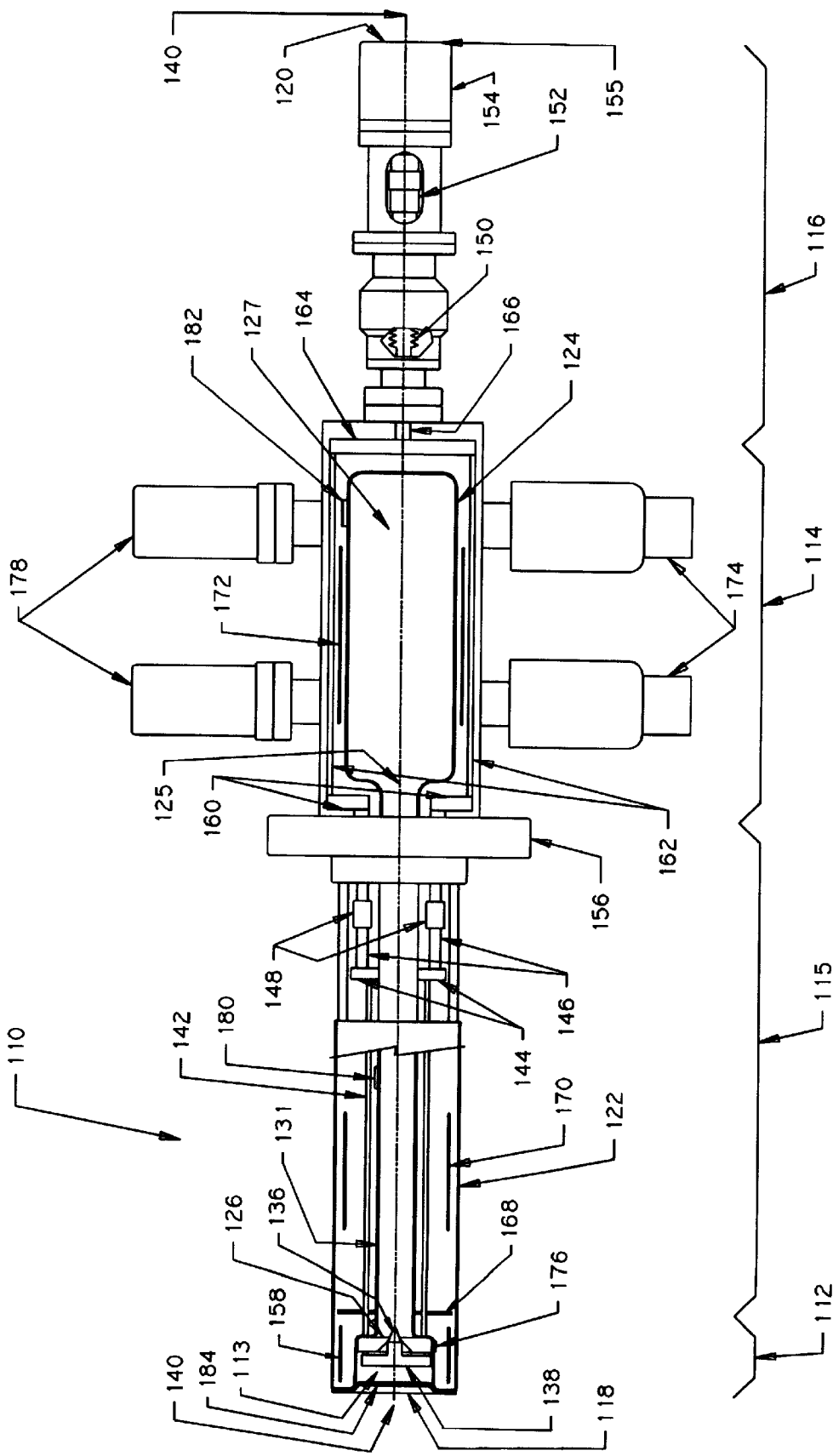
FIG. 6 is a side-view of a second embodiment of an effusion cell with portions cut away to show internal details.

FIG. 6 shows a second embodiment of the effusion cell 110. The effusion cell 110 defines an upper thermal zone 112, an intermediate thermal zone 115, a lower thermal zone 114, and a non-thermal zone 116. The open end 113 of the upper thermal zone 112 defines a distal end 118, and the termination point 155 of the automated valve positioner 154 defines a proximal end 120. A housing 122 is provided as a covering for the effusion cell 110, which extends along a central axis 140 from the upper thermal zone 112 to the mounting flange 156. The housing 122 can be constructed of any metallic, polymeric, or composite material able to withstand the significant heat, pressure, and other stresses an effusion cell is subject to. In a preferred embodiment the housing 122 is constructed of tantalum. Also contemplated and within the scope of the invention is a housing 122 comprising a water jacket (not shown) for cooling the effusion cell during the MBE process.

During use, the effusion cell 110 is maintained in an evacuated state, to allow vapors emanating from heated source material (not shown) to be deposited on a substrate (not shown) via Molecular Bear Epitaxy (MBE). Separate thermal environments corresponding with the upper thermal zone 112, intermediate thermal zone 115, and lower thermal zone 114 within the housing 122, are made possible during use of the effusion cell 110.

The effusion cell 110 is arranged in a linear manner along a central axis 140, with the upper thermal zone 112 most distal, the intermediate thermal zone 115 proximal to the upper thermal zone 112, the lower thermal zone 114 proximal to the intermediate zone, and the non-thermal zone 116 proximal to the lower thermal zone 114, and terminating at the proximal end 120 of the effusion cell 110.

Contained within the housing 122 in the lower thermal zone 114 there is provided a crucible 124 which is used to contain the source material or effluent (not shown) which is to be heated and deposited. The crucible 124 defines an open end 125 and a chamber 127. The crucible 124 can be constructed of any metallic, polymeric, or composite material able to withstand the significant heat, pressure, chemical and other stresses it is subjected to during the MBE process. In a preferred embodiment, the crucible 124 is made of pyrolitic boron nitride (PBN). However, many other materials may also be suitable, depending on the source material to be heated inside the crucible 124. Other suitable crucible materials include such ceramic materials as boron nitride, alumina, aluminum nitride, magnesia, pyrolitic graphite, graphite, beryllia, zirconia, and silicon carbide. Suitable metallic materials include molybdenum and its alloys, tantalum and its alloys, titanium, niobium, platinum, and stainless steel. Extending from the open end of the crucible 125 is a conductance tube 131, which extends distally through the intermediate thermal zone 115. Distally attached to the open end 133 of the conductance tube 131 is a ceramic valve seat 126 as best shown in FIGS. 7 and 8.

The ceramic valve seat 126 is typically fabricated so that a gaseous tight press fit is obtained between the open end 133 of the conductance tube 131 and the valve seat 126. The ceramic valve seat 126 is generally disc-like and defines a diameter 128, a perimeter 129, a depth 130, and a central aperture 132. The central aperture 132 is located generally equidistant from the perimeter 129 of the valve seat 126 and extends through the depth 130 of the valve seat 126. The central aperture 132 defines a tapered channel to provide improved sealing characteristics. At least one and preferably two tie rod slots 134 extend through the depth 130 of the valve seat 126.

Figure 10:
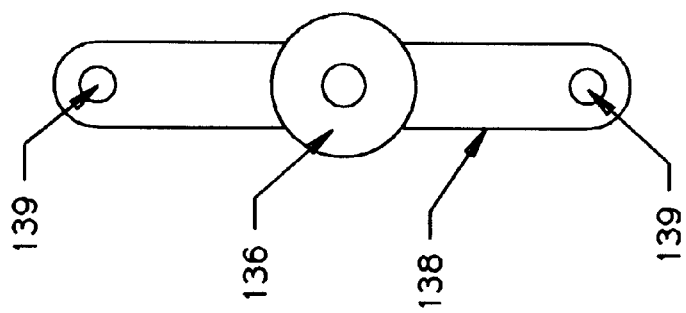
FIG. 10 is a front view of the upper crossbar and ceramic needle of the second embodiment of the invention.
Figure 9:
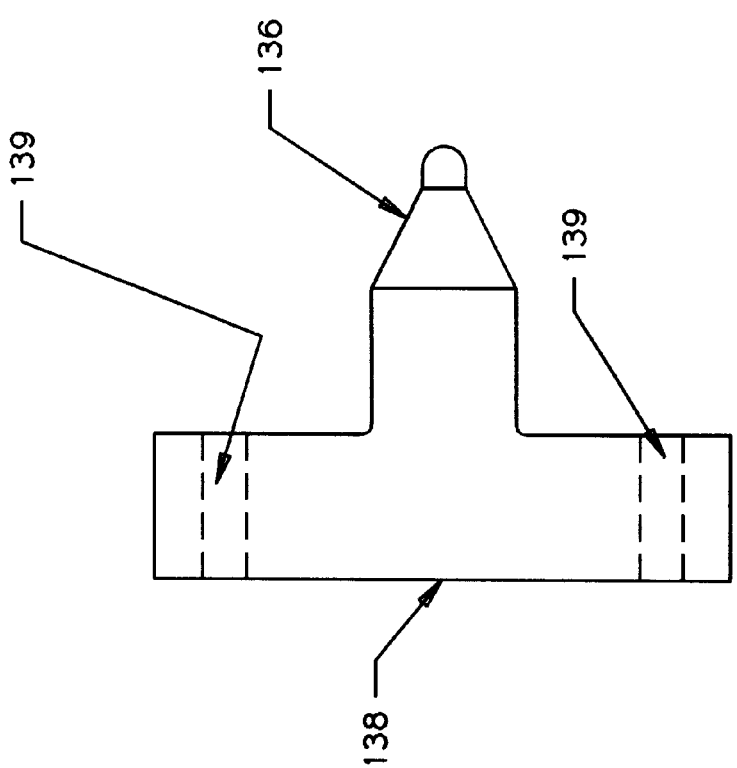
FIG. 9 is a side view of the upper crossbar and ceramic needle of the second embodiment of the invention.

As best shown in FIGS. 9 and 10, a ceramic needle 136 is provided, the outer contours of which are adapted to precisely match the central aperture 132 of the valve seat 126. In a preferred embodiment, the ceramic needle 136 has a conical shape, with the base of the cone mounted to a first crossbar 138 and the opposite end extending toward the central aperture 132 of the ceramic valve seat 126. The first crossbar 138 is provided with at least one and preferably two tie rod apertures 139. The tie rod apertures 139 are adapted to fixedly receive the first set of tie rods 142. The taper of the cone shaped ceramic needle 136 provides mechanical flux modulation by increasing or decreasing the open area between the needle 136 and central aperture 132 of the valve seat 126. This is accomplished by moving the needle 136 in a proximal 120 or distal 118 direction along the central axis 140 of the valve actuation assembly 138, 142, 144, 146, 148, 150, 152, 154, 160, and 162. In a preferred embodiment, the ceramic needle 136 and first crossbar 138 are constructed as a single piece, using conventional machining or molding techniques.

The ceramic valve seat 126 and ceramic needle 136 may be constructed from any ceramic material able to withstand the significant temperature, pressure, chemical and other stresses placed thereon by the MBE process. In a preferred embodiment, the ceramic valve seat 126 and ceramic needle 136 are constructed of graphite coated with pyrolitic boron nitride. Other ceramic materials, however, such as pyrolitic boron nitride, boron nitride, alumina, aluminum nitride, magnesia, pyrolitic graphite, graphite, beryllia, zirconia, and silicon carbide are also contemplated by and within the scope of the invention.

The valve actuation assembly 138, 142, 144, 146, 148, 150, 152, 154, 160, and 162 includes the first crossbar 138, first tie rod or set of tie rods 142, second crossbar or set of crossbars 144, first actuation rod or set of actuation rods 146, valve linkage disconnect or set of valve linkage disconnects 148, third crossbar 160, second tie rod or set of tie rods 162, fourth crossbar 164, second actuation rod 166, bellows 150, micrometer mechanism 152, and automated valve positioner 154. The valve actuation assembly allows the valve position to be precisely controlled from outside the vacuum environment provided by the housing 122. The first crossbar 138 is fixedly attached to at least one and preferably two tie rods 142. The tie rods 142 extend through the tie rod slots 134 of the ceramic valve seat 126 in a slidable manner allowing longitudinal movement of the first crossbar 138, ceramic needle 136, and first set of tie rods 142 along the axis 140 of the valve actuation assembly. This allows the distance between the ceramic needle 136 and ceramic valve seat 126 to be varied in accordance with MBE techniques to provide a wide array of flux patterns to be used with different kinds of source materials. The tie rods 142 are fixedly attached to the second crossbars 144. The second crossbars 144 are centrally attached to the actuation rods 146 which are proximally attached to the valve linkage disconnects 148. The valve linkage disconnects 148 allow a quick disconnect of the valve actuation assembly to load source material. The tie rods 142 can be constructed from a wide variety of materials including but not limited to ceramic materials such as boron nitride, alumina, aluminum nitride, magnesia, pyrolitic graphite, graphite, beryllia, zirconia, and silicon carbide. In a preferred embodiment, the first set of tie rods 142 is constructed from silicon carbide. Metallic materials, such as molybdenum, tantalum, titanium, niobium, and zirconium are also suitable for the first set of tie rods 142, and within the scope of the invention. The valve linkage disconnects 148 are proximally attached to a third crossbar 160. The third crossbar 160 is of a length adapted to fit within the housing 122, yet sufficiently great to provide clearance for the second set of tie rods 162 to be able to extend past the crucible 124 without interfering with the crucible 124 or damaging it during operation.

Proximally attached to the third crossbar 160 and extending longitudinally along the central axis 140 is a second set of tie rods 162. The second set of tie rods 162 is of a length sufficient to span the length of the crucible 124, plus an additional length sufficient to allow longitudinal movement along the central axis 140. At the proximal end of the second set of tie rods 162 is a fourth crossbar 164. The fourth crossbar 164 is of a similar length to the third crossbar 160, and adapted to fit within the housing 122, yet sufficiently longer than the width of the crucible 124 to allow longitudinal movement along the central axis 140 of the combined third crossbar 160, second set of tie rods 162, and fourth crossbar 164. Proximally attached to the fourth crossbar 164 is a second actuation rod 166, which is proximally attached to a bellows 150. The bellows 150 allows axial movement of the valve actuation assembly from outside the vacuum environment provided by the housing 122 without violating the vacuum environment. A micrometer mechanism 152 is attached to the proximal end of the bellows 150, and provides precision longitudinal movement along the central axis 140 by the valve actuation assembly in either a proximal or distal direction. An automated valve positioner 154 is attached to the proximal end of the micrometer mechanism 152 to provide automated control of the position of the micrometer mechanism 152 and attached ceramic needle 136 with regard to the ceramic valve seat 126.

The upper thermal zone 112 is provided with at least a single upper heating element 158. In a preferred embodiment, the upper heating element 158 is a serpentine electrically resistive filament. Thermal separation between the upper thermal zone 112 and intermediate thermal zone 115 is achieved by means of a first heat shield 168. The first heat shield 168 can be made from any material able to shield the significant temperatures generated during the MBE process. In a preferred embodiment, this material is tantalum foil.

The intermediate thermal zone 115 is provided with at least a single intermediate heating element 170 in electrical connection with a power coupling 174. In a preferred embodiment, the intermediate heating element 170 is a serpentine electrically resistive filament. Thermal separation between the intermediate thermal zone 115 and lower thermal zone 114 is achieved by means of a second heat shield (not shown). The second heat shield can be made from any material able to shield the significant temperatures generated during the MBE process. In a preferred embodiment, this material is tantalum foil.

The lower thermal zone 114 is provided with at least a single lower heating element 172 in electrical connection with a power coupling 174. In a preferred embodiment, the lower heating element 172 is a serpentine electrically resistive filament. Thermal separation between the lower thermal zone 114 and non-thermal zone 116 is achieved by means of a third heat shield (not shown). The third heat shield can be made from any material able to shield the significant temperatures generated during the MBE process. In a preferred embodiment, this material is tantalum foil.

The power coupling 174 provides separate electrical connections for the upper heating element 158, intermediate heating element 170, and lower heating element 172 to an electric power source (not shown), allowing different electrical currents to flow to each heating element, thus contributing to achieving separate thermal environments. The power coupling 174 is also in electrical connection with an external control means (not shown), which regulates the separate electrical currents according to externally set parameters, and is automatically monitored during the MBE process by feedback received from the upper 176, intermediate 180, and lower 182 thermocouples.

At least a single upper thermocouple 176 is situated between the housing 122 and the valve seat 126 and first crossbar 138. The upper thermocouple 176 is in electrical connection with a thermocouple connector 178, and is capable of being separately connected with an external control means (not shown), to provide feedback for precisely controlling the internal temperature of the upper thermal zone 112 during the MBE process.

At least a single intermediate thermocouple 180 is situated between the housing 122 and the conductance tube 131. The intermediate thermocouple 180 is in electrical connection with the thermocouple connector 178, and is capable of being separately connected with an external control means (not shown), to provide feedback for precisely controlling the internal thermal environment of the intermediate thermal zone 115 during the MBE process.

At least a single lower thermocouple 182 is situated between the housing 122 and the crucible 124. The lower thermocouple 182 is in electrical connection with the thermocouple connector 178, and is capable of being separately connected with the external control means (not shown), to provide feedback for precisely controlling the internal thermal environment of the lower thermal zone 114 during the MBE process.

A cracking baffle 184 is optionally fitted to the distal end 118 of the effusion cell 110. The cracking baffle 184 ensures that the vaporized source material (not shown) exiting the effusion cell 110 experiences additional collisions prior to exiting the effusion cell 110. The additional collisions further dissociate or "crack" the evaporant into smaller species. The cracking baffle 184 may also be used to enhance the flux beam uniformly.

Use

Using the first embodiment of the effusion cell 10 requires using it in conjunction with an MBE growth chamber (not shown), which is well known. An MBE growth chamber comprises an enclosed structure capable of being evacuated to maintain a vacuum environment during the MBE process. Most MBE growth chambers have removable panels allowing access to the interior for cleaning, loading of substrate, and inspection. The growth chamber necessarily must have an access port (not shown) having a size and configuration compatible with allowing the introduction of the width and length of the housing 22 up to the mounting flange 56. The mounting flange 56 has apertures or other means (not shown) compatible with corresponding means existing on the growth chamber to securely mount the effusion cell 10 to the growth chamber.

Prior to mounting the effusion cell 10 to the growth chamber, the crucible 24 of the effusion cell 10 is loaded with source material (not shown) in an amount sufficient for the deposition that is to occur. The amount of source material necessary to be loaded will vary according to the type of source material, the desired final thickness of deposition, and the size of the substrate (not shown). Because these variables can all be easily controlled, the effusion cell 10 can be used for a wide variety of purposes. Loading the effusion cell 10 requires disconnecting the valve linkage disconnect 48, followed by removal of the ceramic valve seat 26. When this is done, the crucible chamber 27 is accessible, and can be loaded with the desired quantity of source material. In most cases, the source material is loosely loaded into the crucible 24. It is also necessary to place the substrate into the growth chamber prior to commencing the MBE process.

Following loading the effusion cell 10 and placement of the substrate, the effusion cell 10 is inserted into the mounting aperture of the growth chamber and secured to the growth chamber via the mounting flange 56. Next, both the effusion cell 10 and growth chamber are evacuated to the desired level. Due to the differences in variables discussed above, it is impossible to specify a single optimal vacuum level.

The upper 58 and lower 62 heating elements are energized to achieve the desired temperature within the upper thermal zone 12 and lower thermal zone 14 of the effusion cell 10. When the desired temperature is reached, the source material will vaporize, raising the vapor pressure within the crucible 24. Due to the differences in variables discussed above, it is impossible to specify a single optimal temperature for either the upper thermal zone 12 or the lower thermal zone 14. Generally, the upper thermal zone 12 is maintained at a higher temperature relative to the lower thermal zone 14, thus preventing condensation of evaporant on the ceramic valve seat 26 and ceramic needle 36. The lower thermal zone 14 is maintained at a temperature, which provides the desired range of flux pattern and quantity exiting the effusion cell 10. Both the upper thermal zone 12 and lower thermal zone 14 can be maintained at temperatures from room temperature up to a maximum temperature of 1600° C.

Utilizing the valve actuation assembly 38, 42, 44, 46, 48, 50, 52, and 54, the distance between the ceramic valve seat 26 and ceramic needle 36 can be varied to provide a wide array of flux patterns which may be needed. Due to the pressure difference between the crucible 24 and growth chamber (not shown), effluent flows into the growth chamber through the space created between the ceramic needle 36 and ceramic valve seat 26. In MBE this is referred to as molecular flow. However, other source materials can create an effluent which is in a liquid or gaseous form. All forms of effluent are therefore referred to as "fluid".

The upper thermal zone 12, and lower thermal zone 14 have individual heating elements 58, 62, and individual thermocouples 64, 66 to monitor internal environmental conditions, and are in direct electrical connection with a power source. Similarly, the valve position is precisely controllable by an automated source, which can be computer controlled. Because of all these variables are capable of being controlled by a single source such as a computer, any combination of internal environmental conditions is possible using the first embodiment of the effusion cell 10.

Following completion of the MBE process, the growth chamber and first embodiment of the effusion cell 10 are kept hot and under vacuum. Due to the difficulty and length of achieving operating temperature and vacuum, sometimes this condition is maintained for months. There is a load lock system (not shown) for loading and unloading substrates.

Using the second embodiment of the effusion cell 110 requires use in conjunction with an MBE growth chamber (not shown), which is well known. An MBE growth chamber comprises an enclosed structure capable of being evacuated to maintain a vacuum environment during the MBE process. The growth chamber necessarily must have an access port (not shown) having a size and configuration compatible with allowing the introduction of the width and length of the housing 122 up to the mounting flange 156. The mounting flange 156 has apertures or other means (not shown) compatible with corresponding means existing on the growth chamber to securely mount the effusion cell 110 to the growth chamber.

Prior to mounting the effusion cell 110 to the growth chamber, the crucible 124 of the effusion cell 110 is loaded with source material (not shown) in amount sufficient for the deposition that is to occur. The amount of source material necessary to be loaded will vary for many reasons which include the type of source material, the desired final thickness of deposition, and the size and number of the substrates (not shown). Because these variables can all be easily controlled, the effusion cell 110 can be used for a wide variety of purposes. Loading the effusion cell 110 requires disconnecting the valve linkage disconnects 148, followed by removal of the ceramic valve seat 126. When this is done, the crucible chamber 127 is accessible, and can be loaded with the desired quantity of source material. In most cases, the source material is loosely loaded into the crucible 124. It is also necessary to place the substrate into the growth chamber prior to commencing the MBE process.

Following loading the second embodiment of the effusion cell 110 and placement of the substrate, the second embodiment of the effusion cell 110 is inserted into the mounting aperture of the growth chamber and secured to the growth chamber via the mounting flange 156. Next, both the second embodiment of the effusion cell 110 and growth chamber are evacuated to the desired vacuum level. Due to the differences in variables discussed above, it is impossible to specify a single optimal vacuum level.

The upper 158, intermediate 170, and lower 172 heating elements are energized to achieve the desired temperature within the upper thermal zone 112, intermediate thermal zone 115, and lower thermal zone 114 of the second embodiment of the effusion cell 110. When the desired temperature is reached, the source material will vaporize, raising the vapor pressure within the crucible 124. Due to the differences in variables discussed above, it is impossible to specify a single optimal temperature for either the upper thermal zone 112, intermediate thermal zone 115, or the lower thermal zone 114. Generally, the upper thermal zone 112 is maintained at a higher temperature relative to the intermediate thermal zone 115, and lower thermal zone 114, thus preventing condensation or accumulation of evaporant on the ceramic valve seat 126 and ceramic needle 136. The intermediate thermal zone 115 is maintained at a temperature that allows the free passage of vaporized source material through the conductance tube 131. The lower thermal zone 114 is maintained at a temperature that provides the desired range of flux pattern and quantity exiting the second embodiment of the effusion cell 110. The upper thermal zone 112, intermediate thermal zone 115, and lower thermal zone 114 can be maintained at temperatures from room temperature up to a maximum temperature of 1600 degrees C.

Utilizing the valve actuation assembly 138, 142, 144, 146, 148, 150, 152, 154, 160 and 162, the distance between the ceramic valve seat 126 and ceramic needle 136 can be varied to provide a wide array of flux patterns that may be needed. Due to the pressure difference between the crucible 124 and growth chamber (not shown), effluent flows into the growth chamber through the space created between the ceramic needle 136 and ceramic valve seat 126. In MBE this is referred to as molecular flow. However, other source materials can create an effluent which is in a liquid or gaseous form. All forms of effluent are therefore referred to as "fluid".

The upper thermal zone 112, intermediate thermal zone 115, and lower thermal zone 114 have individual heating elements 158, 170, and 172 and individual thermocouples 176, 180, 182 to monitor internal environmental conditions, and are in direct electrical connection with a power source. Similarly, the valve position is precisely controllable by an automated source, which can be computer controlled. Because of all these variables are capable of being controlled by a single source such as a computer, any combination of internal environmental conditions is possible using the second embodiment of the effusion cell 110.

Following completion of the MBE process, the growth chamber (not shown) and first embodiment of the effusion cell 110 are kept hot and under vacuum. Due to the difficulty and length of achieving operating temperature and vacuum, sometimes this condition is maintained for months. There is a load lock system (not shown) for loading and unloading substrates.

I claim:

1. An effusion cell comprising:
   (a) a housing defining a cavity capable of maintaining a vacuum, said housing further defining an upper thermal zone and a lower thermal zone, said upper thermal zone and said lower thermal zone capable of maintaining separate thermal environments;
   (b) a crucible contained within said lower thermal zone, said crucible having an opening;
   (c) a ceramic valve seat defining a central aperture and sealingly engaging said crucible over said opening;
   (d) a ceramic needle positioned within said central aperture and repositionable as between a plurality of open positions allowing fluid flow through said central aperture and a closed position sealingly engaging said ceramic valve seat and preventing fluid flow through said central aperture; and
   (e) wherein said ceramic valve seat and said ceramic needle comprise a valve mechanism.

2. An effusion cell, comprising:
   (a) a housing defining a cavity capable of maintaining a vacuum, said housing further defining an upper thermal zone and a lower thermal zone, said upper thermal zone and said lower thermal zone capable of maintaining separate thermal environments;
   (b) a crucible having an opening contained within said lower thermal zone;
   (c) a ceramic valve seat defining a central aperture and sealingly engaging said crucible over said opening;
   (d) a ceramic needle positioned over said central aperture and repositionable between a plurality of open positions allowing fluid flow through said central aperture and a closed position sealingly engaging said ceramic valve seat and preventing fluid flow through said central aperture;
   (e) means for securing the relative positions of said ceramic valve seat and said ceramic needle relative to each other;
   (f) wherein said ceramic valve seat, said ceramic needle, and said means for securing the relative positions of said valve seat and said needle comprise a valve mechanism;
   (g) heating means within said housing; and
   (h) at least one thermocouple within each of said upper thermal zone and said lower thermal zone.

3. The effusion cell of claim 2, wherein in said means for securing the relative positions of said ceramic valve seat and said ceramic needle relative to each other further comprise at least two longitudinally running tie rods fixedly attached to an upper crossbar into which said ceramic needle is mounted, said tie rods oppositely attached to a lower crossbar, said tie rods slidably fitted through corresponding tie rod slots extending through said ceramic valve seat, said lower crossbar attached to an actuation rod, and said actuation rod attached to a micrometer mechanism, wherein adjustment of said micrometer mechanism causes the position of said ceramic needle to longitudinally vary relative to said ceramic valve seat.

4. An effusion cell, comprising:
   (a) said effusion cell defining a proximal end and a distal end;
   (b) a housing defining a lower thermal zone, an upper thermal zone, and a non-thermal zone, said upper thermal zone terminating at said distal end and said non-thermal zone terminating at said proximal end, said housing capable of maintaining a vacuum;
   (c) said lower thermal zone comprising;
      (i) a crucible defining an interior cavity and at least one opening, said diameter defining an opening;
      (ii) a first heating means adjacent to said crucible; and
      (iii) a first thermocouple adjacent to said crucible;
   (d) a first heat shield between said lower thermal zone and said upper thermal zone;
   (e) said upper thermal zone comprising;
      (i) a ceramic valve seat, defining a diameter, a width, and a central aperture through said width, said valve seat mounted to said opening of said crucible, said valve seat containing at least two tie rod slots through said width, said slots extending in a proximal-distal direction;
      (ii) an upper crossbar, said upper crossbar having a length approximating said diameter of said opening of said crucible;
      (iii) a ceramic needle mounted in said upper crossbar, said ceramic needle adapted to tightly mate with said ceramic valve seat to form a valve mechanism;
      (iv) at least two tie rods fixedly attached to said upper crossbar and extending through said apertures in said valve seat and extending through said lower thermal zone into said non-thermal zone, said tie rods capable of longitudinal movement within said housing, said longitudinal movement resulting in the simultaneous longitudinal movement within said housing of said upper crossbar and said ceramic needle mounted in said upper crossbar, resulting in an opening or closing of said valve mechanism and a corresponding flux modulation;
      (v) a second heating means adjacent to said valve mechanism; and
      (vi) a second thermocouple adjacent to said valve mechanism; and
   (f) said non-thermal zone comprising;
      (i) a lower crossbar fixedly attached to said tie rod;
      (ii) an actuation rod fixedly attached to and extending proximally from said lower crossbar;
      (iii) a bellows proximally located from and attached to said actuation rod, said bellows allowing for longitudinal motion in the vacuum environment of said housing;
      (iv) a micrometer mechanism proximally located from and attached to said bellows for adjusting the position of said bellows;
      (v) an automated valve positioner proximally located and attached to said micrometer mechanism for automatically adjusting said micrometer mechanism, said automated valve positioner in electrical connection with an external controlling source;
      (vi) a mounting flange for securely mounting said effusion cell in an ultra high vacuum growth chamber;

(vii) a thermocouple connector capable of being in electrical connection with said first and second thermocouples and with an external controlling source, for adjusting said separate upper and lower thermal zones; and (viii) a power connector capable of being in electrical connection with said first and second heating elements and an external power source.

5. The effusion cell of claim 4 wherein said ceramic valve seat and said ceramic needle comprise graphite coated with pyrolitic boron nitride.

6. The effusion cell of claim 4 wherein said tie rods are made of a ceramic material.

7. The effusion cell of claim 6 wherein said ceramic material comprises silicon carbide.

* * * * *

UNITED STATES PATENT AND TRADEMARK OFFICE
CERTIFICATE OF CORRECTION

PATENT NO.    : 6,162,300
DATED         : December 19, 2000
INVENTOR(S)   : Bichrt Page 1 of 1

It is certified that error appears in the above-identified patent and that said Letters Patent is hereby corrected as shown below:

Column 2,
Line 58, insert -- Description of the Preferred Embodiments Including Best Mode --

Column 4,
Line 61, replace "dislike" with -- disc-like --

Signed and Sealed this

Second Day of July, 2002

Attest:

Attesting Officer

JAMES E. ROGAN
Director of the United States Patent and Trademark Office